United States Patent
Mende et al.

(10) Patent No.: US 10,514,394 B2
(45) Date of Patent: Dec. 24, 2019

(54) DYNAMIC OUTPUT CLAMPING FOR A PROBE OR ACCESSORY

(71) Applicant: Tektronix, Inc., Beaverton, OR (US)

(72) Inventors: Michael J. Mende, Portland, OR (US); Richard A. Booman, Lake Oswego, OR (US); Wayne M. Wilburn, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/268,433

(22) Filed: Sep. 16, 2016

(65) Prior Publication Data

US 2017/0248631 A1    Aug. 31, 2017

Related U.S. Application Data

(60) Provisional application No. 62/300,660, filed on Feb. 26, 2016.

(51) Int. Cl.
| | |
|---|---|
| *G01R 1/30* | (2006.01) |
| *G01R 1/067* | (2006.01) |
| *G01R 13/00* | (2006.01) |
| *G01R 1/20* | (2006.01) |

(52) U.S. Cl.
CPC .............. *G01R 1/30* (2013.01); *G01R 1/067* (2013.01); *G01R 1/06766* (2013.01); *G01R 1/06788* (2013.01); *G01R 13/00* (2013.01); *G01R 1/20* (2013.01)

(58) Field of Classification Search
CPC ........... F16K 31/53; F16H 35/00; F16H 55/84
See application file for complete search history.

(56) References Cited

U.S. PATENT DOCUMENTS

| | | | | |
|---|---|---|---|---|
| 5,963,023 A  * | 10/1999 | Herrell | ............... | G06F 1/305 |
| | | | | 257/E23.067 |
| 9,316,669 B2 * | 4/2016 | McTigue | ........... | G01R 1/06788 |
| 2005/0185769 A1* | 8/2005 | Pickerd | ................ | G01R 35/005 |
| | | | | 379/30 |
| 2008/0164855 A1* | 7/2008 | Tam | ........................ | G06F 1/263 |
| | | | | 323/233 |
| 2009/0168157 A1* | 7/2009 | Tsurumune | .......... | G02B 21/002 |
| | | | | 359/385 |
| 2009/0322358 A1* | 12/2009 | Imaizumi | ............... | G01R 27/02 |
| | | | | 324/713 |
| 2013/0082695 A1* | 4/2013 | Johnson | ............... | G01R 15/207 |
| | | | | 324/243 |
| 2014/0070831 A1* | 3/2014 | Kushnick | ................ | G01R 1/36 |
| | | | | 324/754.07 |
| 2014/0254051 A1* | 9/2014 | Srivastava | ................ | G05F 1/10 |
| | | | | 361/56 |
| 2014/0320157 A1* | 10/2014 | Brush, IV | ................ | G01R 1/20 |
| | | | | 324/754.01 |
| 2015/0002136 A1* | 1/2015 | McTigue | ........... | G01R 1/06766 |
| | | | | 324/123 R |

(Continued)

*Primary Examiner* — Dominic E Hawkins
(74) *Attorney, Agent, or Firm* — Miller Nash Graham & Dunn; Andrew J. Harrington

(57) ABSTRACT

A probe or accessory for use with an electrical test and measurement instrument can include an input to receive an input signal from a device under test (DUT), a clamp control unit or oscilloscope to apply a clamping/limiting level to the input signal to generate an output signal, and/or a control unit output port to provide the clamped/limited output signal to an oscilloscope.

5 Claims, 4 Drawing Sheets

(56) References Cited

U.S. PATENT DOCUMENTS

2015/0222262 A1* 8/2015 Hanamura ............ H02M 7/003
 327/109
2016/0139178 A1* 5/2016 Johnson ................ G01R 1/067
 324/754.03

* cited by examiner

DYNAMIC OUTPUT CLAMPING FOR A PROBE OR ACCESSORY

CROSS-REFERENCE TO RELATED APPLICATION

This application claims the benefit of U.S. Provisional Patent Application No. 62/300,660, entitled "DYNAMIC OUTPUT CLAMPING FOR A PROBE OR ACCESSORY" and filed on Feb. 26, 2016, the disclosure of which is hereby fully incorporated by reference herein.

TECHNICAL FIELD

This disclosure relates generally to test and measurement systems and more particularly to test and measurement systems having a clamping/limiting feature that may be used to limit the output voltage swing of the test and measurement system into the oscilloscope's input and thus allow the user to increase the vertical sensitivity on the oscilloscope without it being overdriven and/or subject to saturating.

BACKGROUND OF THE INVENTION

Ideally, a test and measurement system would have the bandwidth and large input dynamic range that would allow users to measure signals with wide voltage swings and then be able to zoom in on the finer details of that signal to look at the small voltage components of that signal that are in the 1 mVs-100 mVs range. A good use case of this is trying to measure the dynamic ON resistance of a switching device (such as a diode, a FET, an IGBT, and so on). Trying to look at the voltage $V_{ds}$(on) and the switching/conduction losses associated with the $V_{ds}$(on) state after it has come out of and going into the $V_{ds}$(off) state (i.e., high voltage) has been an ongoing challenge and a key measurement for users, especially as users need to achieve higher efficiencies and understanding of the losses in their systems (such as SMPS, Inverters, Motor drives, and so on).

Thus, a needs remains to introduce a break-through measurement solution to address these measurement challenges.

DETAILED DESCRIPTION

Figure 1:
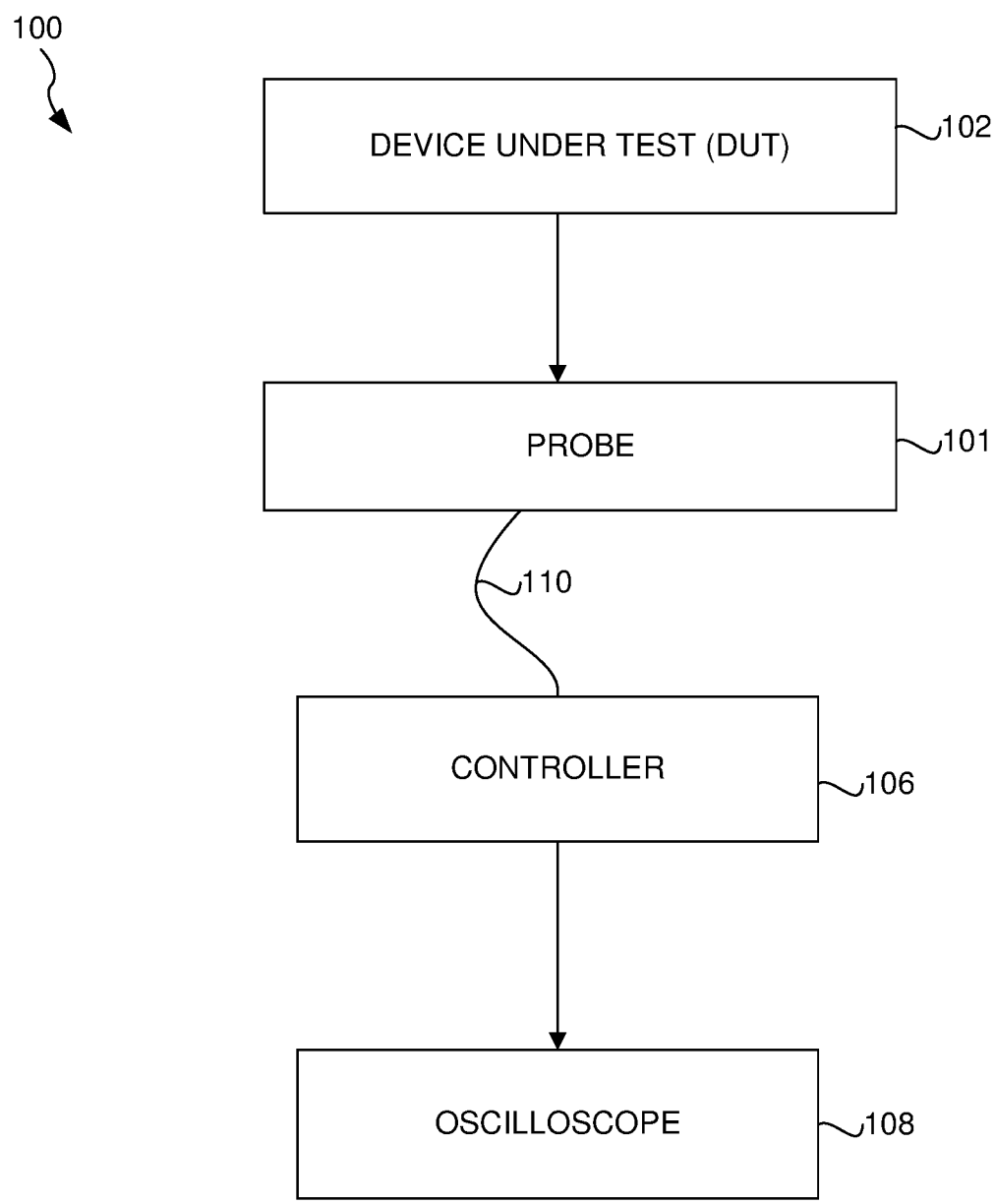
FIG. 1 illustrates an example of a prior test and measurement system.

In the drawings, which are not necessarily to scale, like or corresponding elements of the disclosed systems and methods are denoted by the same reference numerals.

FIG. 1 illustrates an example of a test and measurement system 100 that uses a probe 101 or other accessory. Initially, a signal may be measured from a device under test (DUT) 102 by the probe 101. The measurement from the probe 101 may then be sent to a controller 106 or oscilloscope 108, e.g., through a communication link 110. The controller 106 may be connected to a test instrument such as an oscilloscope 108 in order to display the measurement on a display (not shown) of the oscilloscope 108.

It should be noted that certain alternative implementations of the test and measurement system 100 may not include the controller 106. In such implementations, the probe 101 may be electrically coupled directly with the oscilloscope 108.

Probe and accessory outputs, especially power probes, have strived to achieve a fast over-drive recovery when the probe/accessory's input exceeds its input limits, trying to recover in tens of nanoseconds (ns). While a given probe or accessory can usually recover within tens of nanoseconds, the oscilloscope input generally takes several times that, e.g., tens of microseconds (usec) in some cases, to recover. So, the probe or accessory tends to recover after its input limits have been exceeded but the oscilloscope input may lag due to the slower over-drive recovery of the oscilloscope input. A typical power probe or accessory output may swing between +/−1V to +/−10V on the output of the probe or accessory during these measurements, which may exceed the input level of the oscilloscope's front end when the oscilloscope's vertical input sensitivity is increased.

In certain implementations, a probe or accessory may dynamically limit/clamp its output voltage swing in order to prevent the oscilloscope's front end from saturating/clipping, thereby maintaining its ability to zoom in and see the finer details of a large signal. This can be accomplished by a variety of clamping/limiting schemes incorporated somewhere in the probe/accessory's signal path that can be adjusted based on the desired output clamping levels required. These clamping/limiting circuits may advantageously clamp/limit the peak voltage of the output waveform to a specific/defined voltage envelope that will generally not exceed the linear input range of the oscilloscope, thus preventing the oscilloscope input from being over-driven. These clamping/limiting upper and lower threshold levels can be made to track each other or be controlled independently of each other.

Implementations of the disclosed technology may include a probe or accessory having a user selectable output clamping/limiting feature that, when enabled, may serve to limit the output voltage swing of the measurement system into the oscilloscope's input and thus allow the user to increase the vertical sensitivity on the oscilloscope without it being overdriven/saturated. While this may generally be a user selectable function, it may be incorporated into the overall measurement system in alternative embodiments such that it would be dynamically controlled by the oscilloscope, e.g., as the user changes the oscilloscope input sensitivity, offset, etc. This may serve to make the feature transparent to the user and also assist the user with avoiding the trap of having to deal with distorted and/or rolled-off waveforms by not understanding that the front end of the oscilloscope may become saturated/over-driven when the user is changing the measurement system settings. The probe or accessory may be configured to never drive the oscilloscope input into a saturation or clipping condition.

Figure 2:
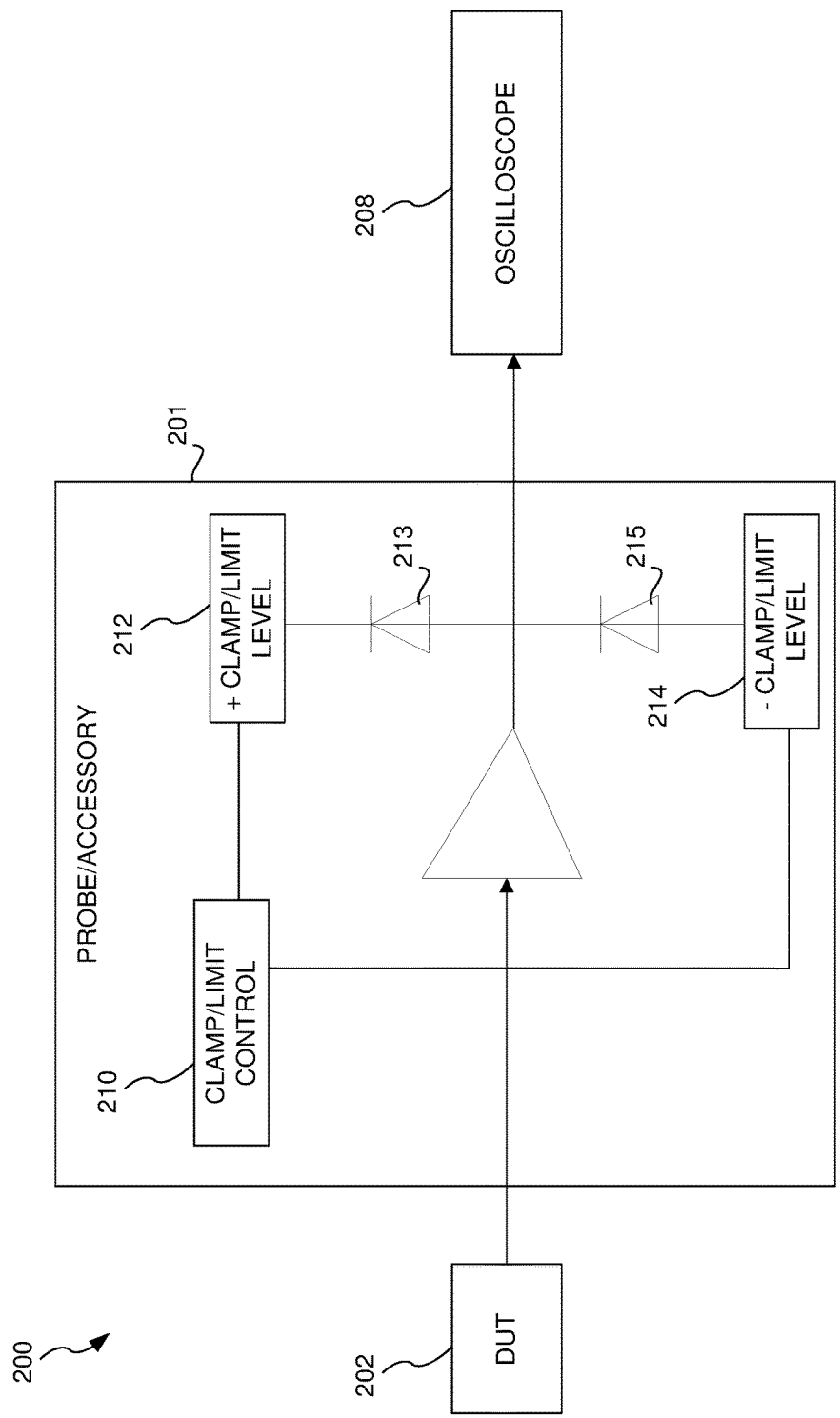
FIG. 2 illustrates an example of a test and measurement system in accordance with certain implementations of the disclosed technology.

FIG. 2 illustrates an example of a test and measurement system 200 in accordance with certain implementations of the disclosed technology.

In the example, a probe 201 or other accessory is electrically coupled between a device under test (DUT) 202 and an oscilloscope 208 or other suitable measurement instrument. The probe 201 receives an input signal from the DUT 202 and provides an output signal to the oscilloscope 208. The probe 201 or accessory includes a clamp/limit control block 210 that is configured to control a positive (+) clamp/limit level 212 and a negative (−) clamp/limit level 214.

Figure 3:
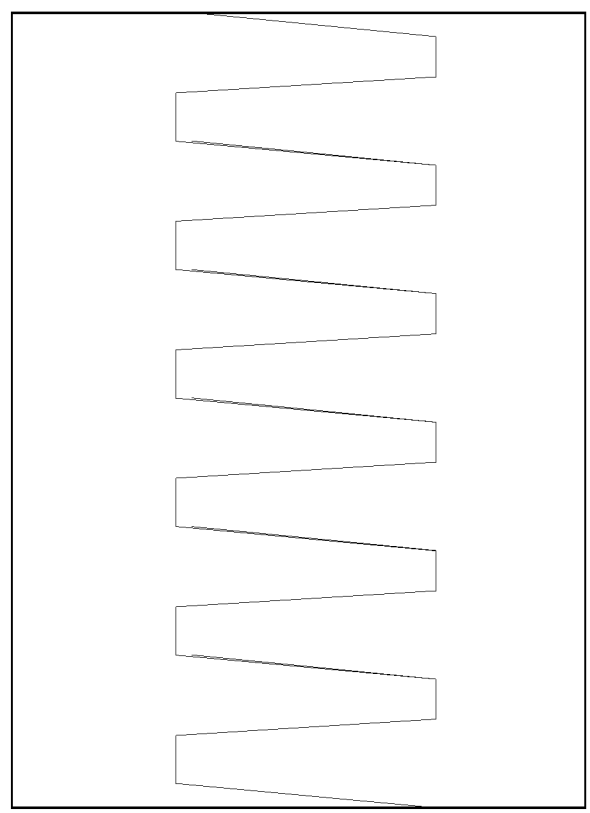
FIG. 3 illustrates an example of an input signal for a test and measurement system such as the test and measurement system illustrated by FIG. 2.

FIG. 3 illustrates an example of an input signal 300 for a test and measurement system in accordance with certain implementations of the disclosed technology such as the test and measurement system 200 illustrated by FIG. 2.

Figure 4:
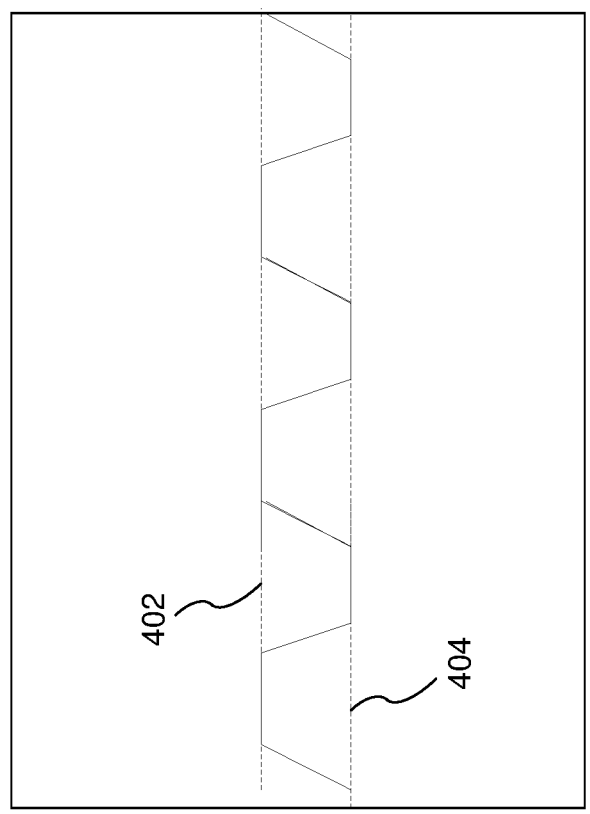
FIG. 4 illustrates an example of an output signal for a test and measurement system such as the test and measurement system illustrated by FIG. 2.

FIG. 4 illustrates an example of an output signal 400 for a test and measurement system in accordance with certain implementations of the disclosed technology such as the test and measurement system 200 illustrated by FIG. 2. In the example, the impact by the positive (+) clamp/limit level 402 and the negative (−) clamp/limit level 404 on the input signal can be readily ascertained by a user of the oscilloscope displaying the signal 400.

The dynamic output clamping scheme, such as that implemented by the system 200 of FIG. 2, advantageously enables the user of the probe 201 or accessory to measure the small level signals by clamping the output voltage that is fed into the input, e.g., front end, of the oscilloscope 208 and prevent it from saturating/overdriving the oscilloscope 208 input when the user tries to zoom in (e.g., increase vertical sensitivity) and maintain a fast settling time (e.g., over-drive recovery (ODR).

This implementation of output clamping/limiting could be implemented into the front end of the oscilloscope 208 to increase its over-drive recovery (ODR) performance which allows the oscilloscope 208 to be capable of withstanding large input voltages. Clamping/gating/limiting the input voltage by the probe 201 may advantageously prevent the oscilloscope 208 front end from being driven into saturation and, consequently, needing a significant amount of time to recover from it.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. An electrical test and measurement system, comprising:
a device under test (DUT);
an oscilloscope; and
a probe, the probe including:
an input configured to receive an input signal from the DUT;
a clamp control unit configured to apply at least one clamping/limiting level to the input signal to generate an output signal, wherein the at least one clamping/limiting level is dynamically determined by the oscilloscope based on one or more changes to measurement settings of the oscilloscope; and
an output port configured to provide the clamped/limited output signal to the oscilloscope.

2. The system of claim 1, further comprising a first diode configured to implement a positive clamping level and a second diode configured to implement a negative clamping level.

3. A method for an electrical test and measurement instrument, the method comprising:
receiving an input signal from a device under test (DUT);
detecting a change to measurement settings of the electrical test and measurement device;
dynamically determining, by the electrical test and measurement instrument, a clamping/limiting level based on the change to the measurement settings;
applying the determined clamping/limiting level to the input signal to generate an output signal; and
providing the clamped/limited output signal to the electrical test and measurement instrument
wherein the dynamically determining includes:
dynamically determining a positive clamping/limiting level based on the change to the measurement settings; and
dynamically determining a negative clamping/limiting level based on the change to the measurement settings,
and wherein the applying includes:
applying the positive clamping/limiting level to the input signal; and
applying the negative clamping/limiting level to the input signal.

4. A method for an oscilloscope, the method comprising:
receiving an input signal from a device under test (DUT);
detecting a change to measurement settings of the oscilloscope;
dynamically determining, by the oscilloscope, a clamping/limiting level based on the change to the measurement settings; and
applying at least one clamping/limiting level at an input of the oscilloscope to prevent an overdrive/saturating condition from occurring with a front end of the oscilloscope.

5. The method of claim 4,
wherein the dynamically determining includes:
dynamically determining a positive clamping/limiting level based on the change to the measurement settings; and
dynamically determining a negative clamping/limiting level based on the change to the measurement settings,
wherein the applying includes:
applying the positive clamping/limiting level to the input signal; and
applying the negative clamping/limiting level to the input signal.

* * * * *